United States Patent
Zan et al.

(10) Patent No.: US 9,368,634 B2
(45) Date of Patent: Jun. 14, 2016

(54) DISPLAY PANEL, THIN FILM TRANSISTOR AND METHOD OF FABRICATING THE SAME

(71) Applicant: E Ink Holdings Inc., Hsinchu (TW)

(72) Inventors: Hsiao-Wen Zan, Hsinchu (TW); Chuang-Chuang Tsai, Hsinchu (TW); Xue-Hung Tsai, Hsinchu (TW); Henry Wang, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 13 days.

(21) Appl. No.: 13/832,099

(22) Filed: Mar. 15, 2013

(65) Prior Publication Data

US 2014/0034944 A1 Feb. 6, 2014

(30) Foreign Application Priority Data

Jul. 31, 2012 (TW) ............................... 101127636 A

(51) Int. Cl.
*H01L 29/786* (2006.01)
*H01L 29/66* (2006.01)

(52) U.S. Cl.
CPC ...... *H01L 29/7869* (2013.01); *H01L 29/66742* (2013.01); *H01L 29/78696* (2013.01)

(58) Field of Classification Search
CPC ..................... H01L 29/7869; H01L 29/66969; H01L 29/78696; H01L 29/66742
USPC ........................................................ 257/43
See application file for complete search history.

(56) References Cited

U.S. PATENT DOCUMENTS

| 8,062,936 | B2 | 11/2011 | Seo et al. | |
|---|---|---|---|---|
| 8,329,506 | B2* | 12/2012 | Akimoto | H01L 29/04 257/E21.462 |
| 8,404,302 | B2* | 3/2013 | Maa et al. | 427/162 |
| 8,558,233 | B2* | 10/2013 | Yamazaki | 257/57 |
| 2009/0278120 | A1* | 11/2009 | Lee et al. | 257/43 |
| 2010/0051949 | A1* | 3/2010 | Yamazaki et al. | 257/57 |
| 2010/0123128 | A1* | 5/2010 | Jeon et al. | 257/43 |

(Continued)

FOREIGN PATENT DOCUMENTS

| TW | 200718476 | 5/2007 |
|---|---|---|
| TW | I290371 | 11/2007 |

(Continued)

OTHER PUBLICATIONS

"Office Action of Taiwan Counterpart Application", issued on Sep. 18, 2014, p.1-12, in which the listed references were cited.

*Primary Examiner* — Latanya N Crawford
(74) *Attorney, Agent, or Firm* — Jianq Chyun IP Office

(57) ABSTRACT

A thin film transistor (TFT) including a gate, a dielectric layer, a metal-oxide semiconductor channel, a source, and a drain is provided. The gate and the metal-oxide semiconductor channel are overlapped. The gate, the source, and the drain are separated by the dielectric layer. Besides, the source and the drain are respectively located on two opposite sides of the metal-oxide semiconductor channel. The metal-oxide semiconductor channel includes a metal-oxide semiconductor layer and a plurality of nano micro structures disposed in the metal-oxide semiconductor layer and separated from one another. In another aspect, a display panel including the TFT and a method of fabricating the TFT are also provided.

12 Claims, 13 Drawing Sheets

(56) References Cited

U.S. PATENT DOCUMENTS

| | | |
|---|---|---|
| 2010/0123130 A1* | 5/2010 | Akimoto et al. ................ 257/43 |
| 2010/0123132 A1 | 5/2010 | Nakata et al. |
| 2010/0163867 A1* | 7/2010 | Yamazaki ......... H01L 29/66969 257/43 |
| 2010/0193783 A1* | 8/2010 | Yamazaki et al. .............. 257/43 |
| 2010/0213478 A1 | 8/2010 | Cho |
| 2011/0248260 A1* | 10/2011 | Yamazaki ....................... 257/43 |
| 2012/0080678 A1 | 4/2012 | Kim et al. |
| 2013/0200361 A1* | 8/2013 | Tsang ............................. 257/43 |
| 2013/0299827 A1* | 11/2013 | Yamazaki et al. .............. 257/43 |

FOREIGN PATENT DOCUMENTS

| | | |
|---|---|---|
| TW | 200849335 | 12/2008 |
| WO | 2010038570 | 4/2010 |

* cited by examiner

DISPLAY PANEL, THIN FILM TRANSISTOR AND METHOD OF FABRICATING THE SAME

CROSS-REFERENCE TO RELATED APPLICATION

This application claims the priority benefit of Taiwan application serial no. 101127636, filed on Jul. 31, 2012. The entirety of the above-mentioned patent application is hereby incorporated by reference herein and made a part of this specification.

BACKGROUND OF THE INVENTION

1. Field of the Invention

The invention relates to an electronic device, a method of fabricating the same, and an electronic apparatus including the electronic device. More particularly, the invention relates to a thin film transistor (TFT), a method of fabricating the same, and a display panel including the TFT.

2. Background of the Invention

As environmental concerns rise, flat display panels that are characterized by low power consumption, favorable space utilization, absence of radiation, and high resolution have held the dominating position in the market. At present, the most common types of flat displays include liquid crystal displays (LCD), plasma displays, organic electroluminescent displays (OELD), and so forth. The most popular LCD, for instance, includes a thin film transistor (TFT) array substrate, a color filter substrate, and a liquid crystal layer sandwiched between the two substrates. In the conventional TFT array substrate, an a-Si TFT or a low temperature polysilicon TFT often serves as a switch device of each sub-pixel. It has been indicated in recent researches that an oxide semiconductor TFT has favorable field-effect mobility in comparison with the a-Si TFT, and the oxide semiconductor TFT has satisfactory threshold voltage (Vth) uniformity in comparison with the low temperature polysilicon TFT. Therefore, the oxide semiconductor TFT has the potential for playing the crucial role in the next generation flat display. Given the existing structure, however, the conventional oxide semiconductor TFT may not be able to have the enhanced field-effect mobility.

SUMMARY OF THE INVENTION

The invention is directed to a method of fabricating a thin film transistor (TFT) with high field-effect mobility.

The invention is further directed to a TFT with sufficient field-effect mobility.

The invention is further directed to a display panel with promising electrical properties.

In an embodiment of the invention, a method of fabricating a TFT includes following steps. A first base is provided. A gate is formed on the first base. A dielectric layer is formed on the first base. A metal-oxide semiconductor channel is formed on the first base. Here, the metal-oxide semiconductor channel includes a metal-oxide semiconductor layer and a plurality of nano micro structures, and the nano micro structures are located in the metal-oxide semiconductor layer and separated from one another. A source and a drain are formed on the first base. The gate and the metal-oxide semiconductor channel are overlapped. The gate, the source, and the drain are separated by the dielectric layer. Besides, the source and the drain are respectively located on two opposite sides of the metal-oxide semiconductor channel.

In an embodiment of the invention, a TFT including a gate, a dielectric layer, a metal-oxide semiconductor channel, a source, and a drain is provided. The gate and the metal-oxide semiconductor channel are overlapped. The gate, the source, and the drain are separated by the dielectric layer. Besides, the source and the drain are respectively located on two opposite sides of the metal-oxide semiconductor channel. The metal-oxide semiconductor channel includes a metal-oxide semiconductor layer and a plurality of nano micro structures disposed in the metal-oxide semiconductor layer and separated from one another.

In an embodiment of the invention, a display panel that includes a TFT array substrate, an opposite substrate disposed opposite to the TFT array substrate, and a display medium disposed between the TFT array substrate and the opposite substrate is provided. The TFT array substrate includes a first base and the TFTs. The TFTs are arranged in arrays on the first base.

According to an embodiment of the invention, the nano micro structures are a plurality of nano particles.

According to an embodiment of the invention, the step of forming the metal-oxide semiconductor channel on the first base includes: placing the nano particles on the first base and forming the metal-oxide semiconductor layer on the nano particles to cover the nano particles.

According to an embodiment of the invention, the step of forming the metal-oxide semiconductor channel on the first base includes: providing the nano particles, providing a metal-oxide semiconductor precursor, mixing the nano particles and the metal-oxide semiconductor precursor to form a mixed solution, and solidifying the mixed solution on the first base to form the metal-oxide semiconductor channel.

According to an embodiment of the invention, carrier concentration of the nano particles is greater than carrier concentration of the metal-oxide semiconductor layer.

According to an embodiment of the invention, each of the nano micro structures is a nano pore, and inner walls of the nano pores are conductive.

According to an embodiment of the invention, the step of forming the metal-oxide semiconductor channel on the first base includes: forming a metal-oxide semiconductor pre-channel on the first base, wherein the metal-oxide semiconductor pre-channel includes the metal-oxide semiconductor layer and the nano micro structures, and the nano micro structures are located in the metal-oxide semiconductor layer and separated from one another; removing the nano particles in the metal-oxide semiconductor layer to form the nano pores; performing surface treatment on the inner walls of the nano pores to effect conductivity of the inner walls of the nano pores.

According to an embodiment of the invention, the step of removing the nano particles in the metal-oxide semiconductor layer may be performed by means of an adhesive, a solvent, or plasma.

According to an embodiment of the invention, the step of performing the surface treatment on the inner walls of the nano pores to effect the conductivity of the inner walls of the nano pores may be conducted by means of plasma, a reactive gas, ultraviolet light, or a reactive liquid.

According to an embodiment of the invention, a material of the nano particles is organic.

According to an embodiment of the invention, a material of the metal-oxide semiconductor layer includes but should not be limited to aluminum zinc oxide (AZO), indium zinc oxide (IZO), indium zinc tin oxide (IZTO), indium-gallium-zinc oxide (IGZO), indium gallium oxide (IGO), zinc oxide (ZnO), cadmium oxide•germanium dioxide ($2CdO.GeO_2$), or nickel cobalt oxide ($NiCo_2O_4$); a material of the nano micro structures includes but should not be limited to a conductor (e.g., ITO) or a semiconductor (e.g. IZO).

In light of the foregoing, the metal-oxide semiconductor channel in the TFT and the display panel described herein includes a plurality of nano micro structures, and accordingly the field-effect mobility of the metal-oxide semiconductor channel may be improved. Moreover, the TFT and the display panel including the metal-oxide semiconductor channel may have promising electrical properties.

Several exemplary embodiments accompanied with figures are described in detail below to further explain the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EXEMPLARY EMBODIMENTS

First Embodiment

Method of Fabricating a Thin Film Transistor

Figure 1A:
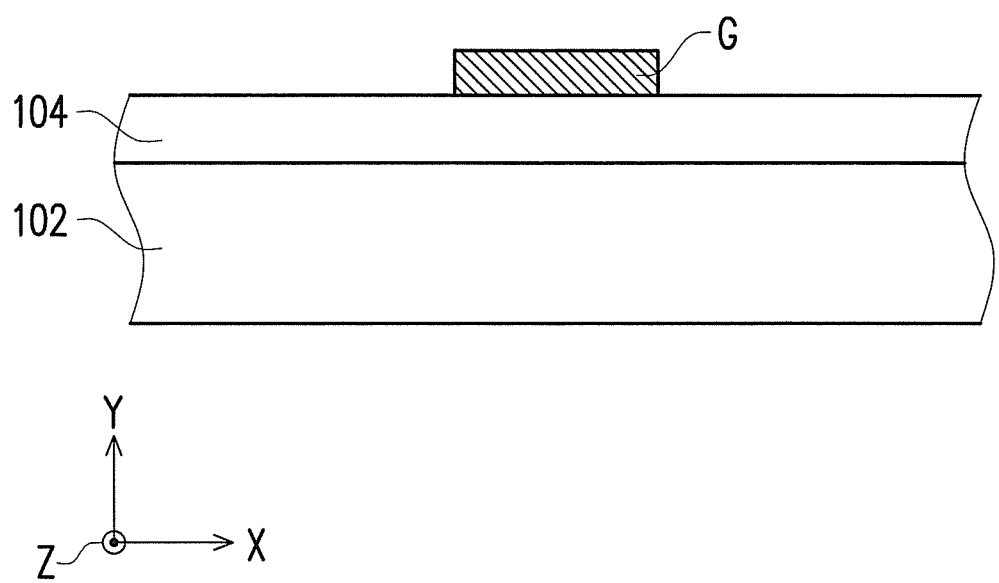
FIG. 1A to FIG. 1D are schematic cross-sectional views illustrating a method of fabricating a thin film transistor (TFT) according to a first embodiment of the invention.

FIG. 1A to FIG. 1D are schematic cross-sectional views illustrating a method of fabricating a thin film transistor (TFT) according to a first embodiment of the invention. With reference to FIG. 1A, a first base 102 is provided. In the present embodiment, the first base 102 mainly serves to hold the overlying device and may be made of glass, quartz, organic polymer, an opaque/reflective material (e.g., a conductive material, wafer, ceramics, or any other appropriate material), or any other appropriate material.

As shown in FIG. 1A, a gate G is formed on the first base 102. Before the gate G is formed, an insulation layer 104 may be formed on the first base 102 according to the present embodiment. The insulation layer 104 is disposed between the first base 102 and the gate G. Roughly speaking, the gate G is made of a metal material. However, the invention is not limited thereto, and the gate G may be made of other conductive materials in other embodiments, such as alloy, metal nitride, metal oxide, metal oxynitride, or a stacked layer containing metal and other conductive materials. The insulation layer 104 may be made of an inorganic material (e.g., silicon oxide, silicon nitride, silicon oxynitride, or a stacked layer containing at least two of the above-mentioned materials), an organic material, or a combination thereof.

Figure 1B:
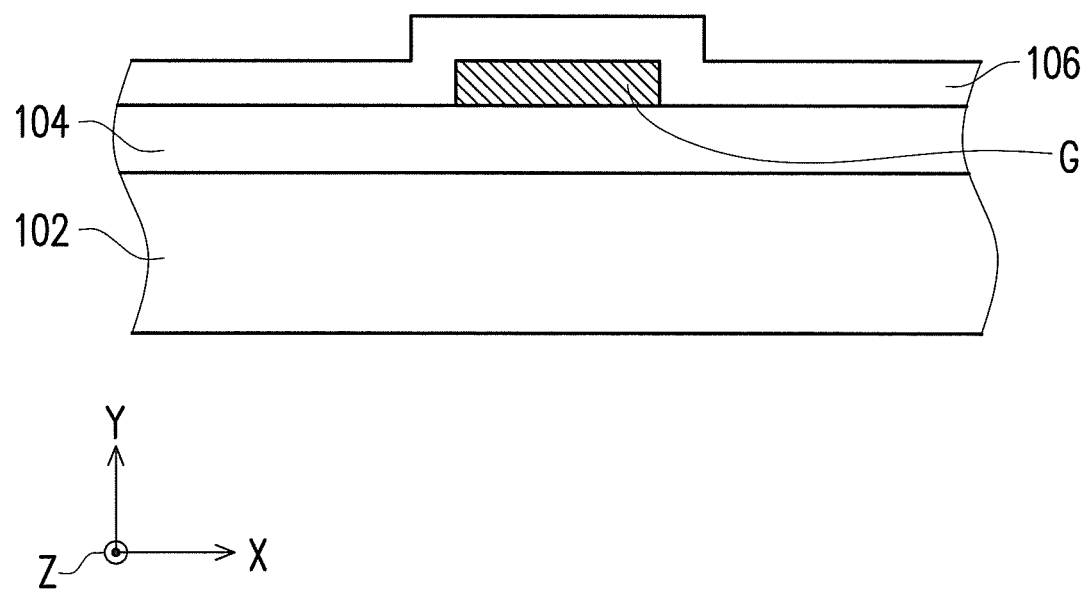

With reference to FIG. 1B, a dielectric layer 106 is formed on the first base 102. In the present embodiment, the dielectric layer 106 covers the gate G. Besides, the dielectric layer 106 also covers the insulation layer 104. Here, the dielectric layer 106 may be made of an inorganic material (e.g., silicon oxide, silicon nitride, silicon oxynitride, or a stacked layer containing at least two of the above-mentioned materials), an organic material, or a combination thereof.

Figure 1C:
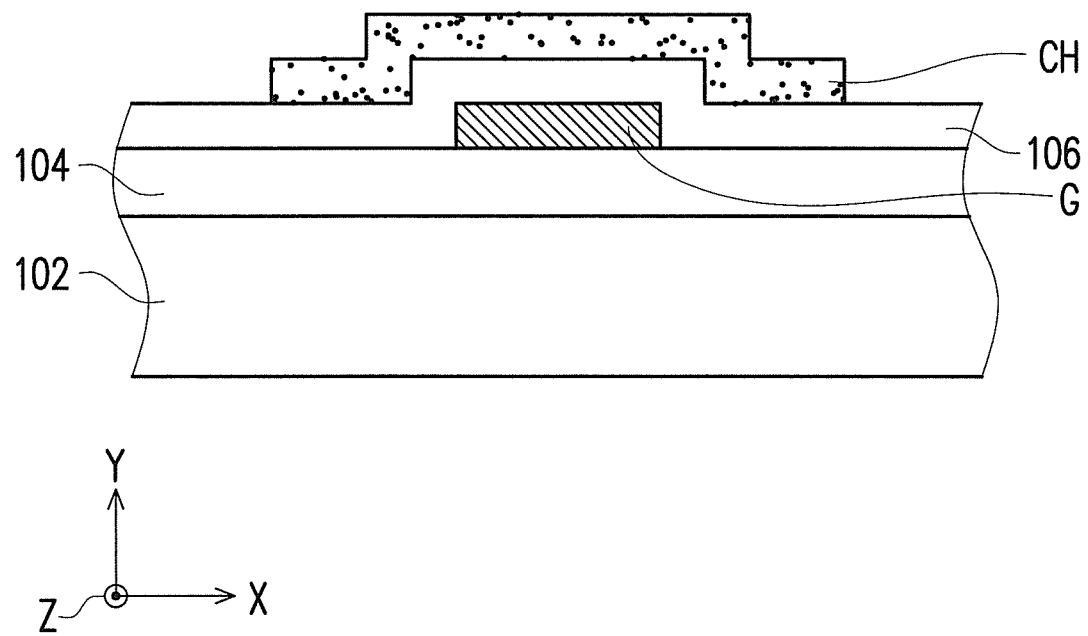
Figure 2:
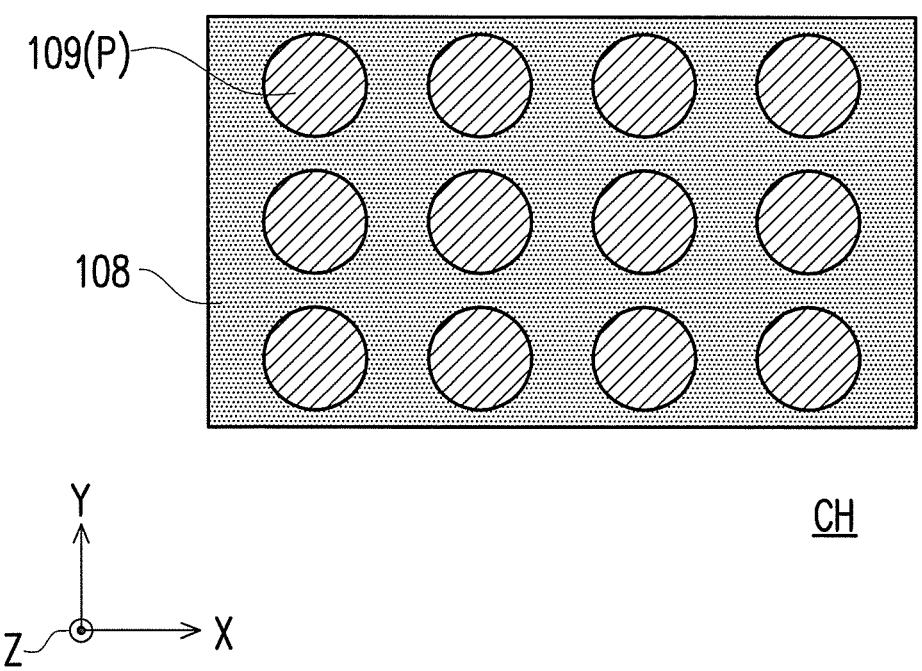
FIG. 2 is a schematic cross-sectional view illustrating a metal-oxide semiconductor channel according to the first embodiment of the invention.
Figure 3:
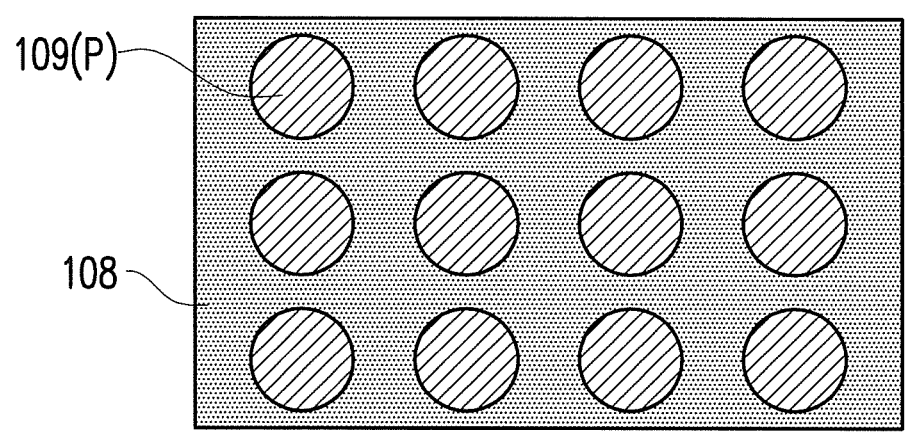
FIG. 3 is a schematic top view illustrating the metal-oxide semiconductor channel according to the first embodiment of the invention.
Figure 3:

With reference to FIG. 1C, a metal-oxide semiconductor channel CH is formed on the first base 102. The metal-oxide semiconductor channel CH may be formed on the dielectric layer 106 according to the present embodiment. In addition, the gate G and the metal-oxide semiconductor channel CH are overlapped. FIG. 2 is a schematic cross-sectional view illustrating a metal-oxide semiconductor channel according to the first embodiment of the invention. FIG. 3 is a schematic top view illustrating the metal-oxide semiconductor channel according to the first embodiment of the invention. With reference to FIG. 2 and FIG. 3, the metal-oxide semiconductor channel CH described in the present embodiment includes a metal-oxide semiconductor layer 108 and a plurality of nano micro structures 109 disposed in the metal-oxide semiconductor layer 108 and separated from one another. Here, each of the nano micro structures 109 may have a dimension ranging from less than ten nanometers to hundreds of nanometers, e.g., 50 nanometers. The nano micro structures 109 described in the present embodiment may be a plurality of nano particles P. According to the present embodiment, the nano micro structures 109 may have a circular shape. However, the shape of the nano micro structures 109 is not limited in the invention and may be properly adjusted according to actual requirements.

There are a number of methods of forming the metal-oxide semiconductor channel CH in the present embodiment. For instance, the metal-oxide semiconductor channel CH may be formed through conducting a stacking method or a solution method according to the present embodiment, which will be respectively elaborated hereinafter with reference to FIG. 4A to FIG. 4E and FIG. 5A to FIG. 5D.

Figure 4A:
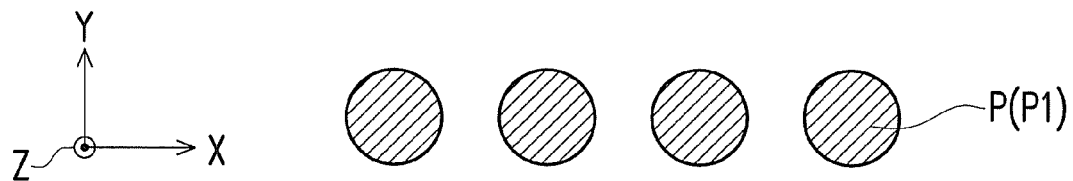
FIG. 4A to FIG. 4E are flow charts illustrating a process of forming a metal-oxide semiconductor channel through conducting a stacking method according to an embodiment of the invention.
Figure 4B:
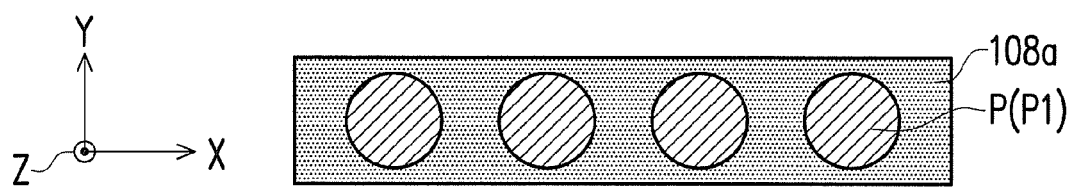
Figure 4C:
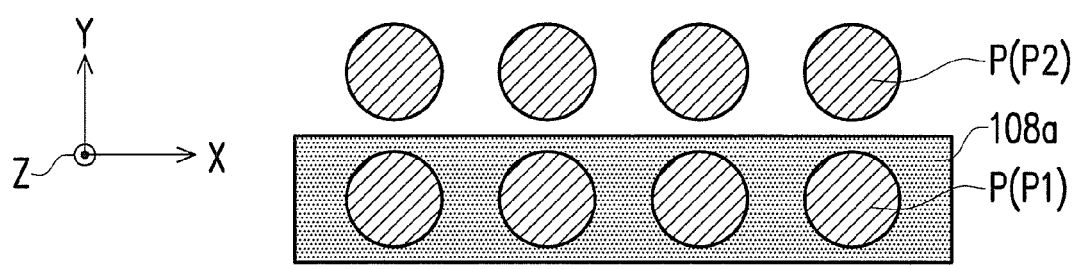
Figure 4D:
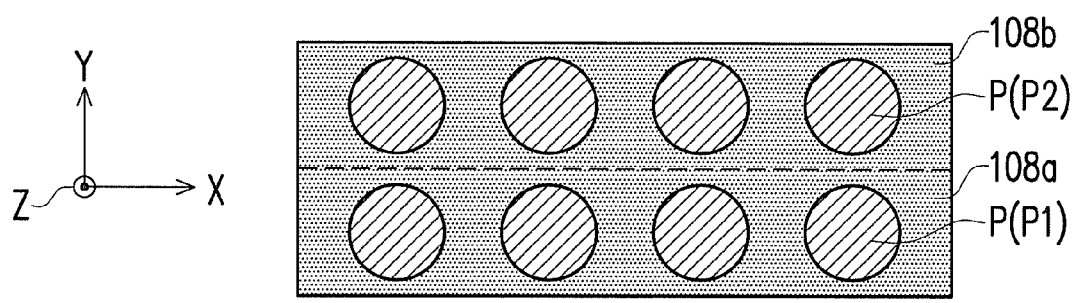
Figure 4E:
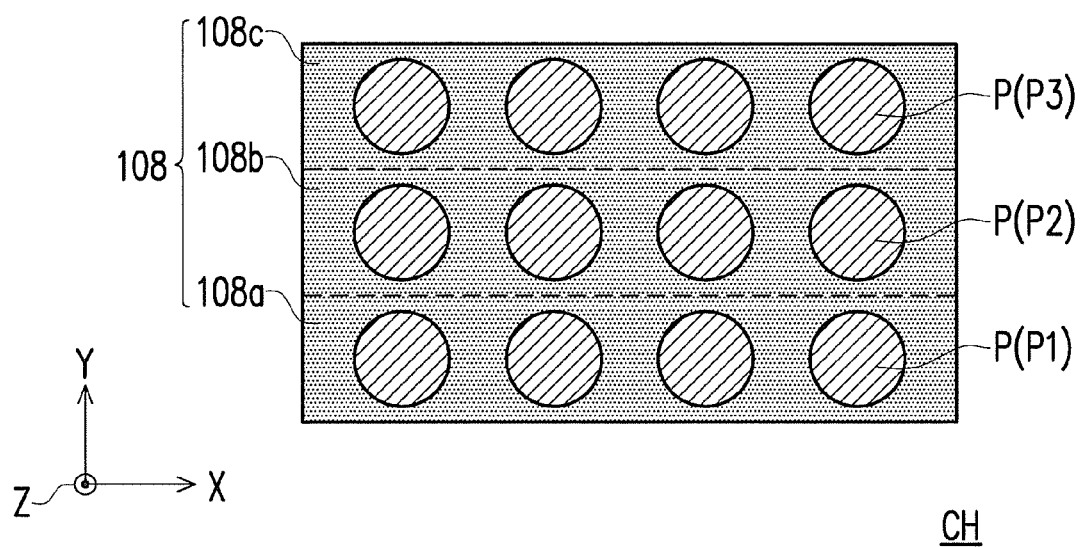

FIG. 4A to FIG. 4E are flow charts illustrating a process of forming a metal-oxide semiconductor channel through conducting a stacking method according to an embodiment of the invention. As shown in FIG. 4A, a plurality of nano particles P1 are placed on a first base (not shown). In FIG. 4B, a metal-oxide semiconductor layer 108a is formed on the nano particles P1 to cover the nano particles P1. In FIG. 4C, a plurality of nano particles P2 are placed on the nano particles P1 and the metal-oxide semiconductor layer 108a. In FIG. 4D, a metal-oxide semiconductor layer 108b is formed on the nano particles P1 and P2 and the metal-oxide semiconductor layer 108a to cover the nano particles P2. In FIG. 4E, a plurality of nano particles P3 are placed on the nano particles P1 and P2 and the metal-oxide semiconductor layers 108a and 108b, and a metal-oxide semiconductor layer 108c is formed on the nano particles P1, P2, and P3 and the metal-oxide semiconductor layers 108a and 108b, so as to cover the nano particles P3. In brief, according to the present embodiment, layers of nano particles (where the nano particles P1, P2, and P3 are located) and the metal-oxide semiconductor layers 108a, 108b, and 108c may be alternatively stacked, so as to form the metal-oxide semiconductor channel CH described herein. It should be mentioned that three layers of nano particles and three metal-oxide semiconductor layers 108a, 108b, and 108c are exemplarily shown in FIG. 4E, while the number of layers of nano particles and the number of the metal-oxide semiconductor layers are not limited in the invention and may be properly determined according to actual requirements.

Figure 5A:
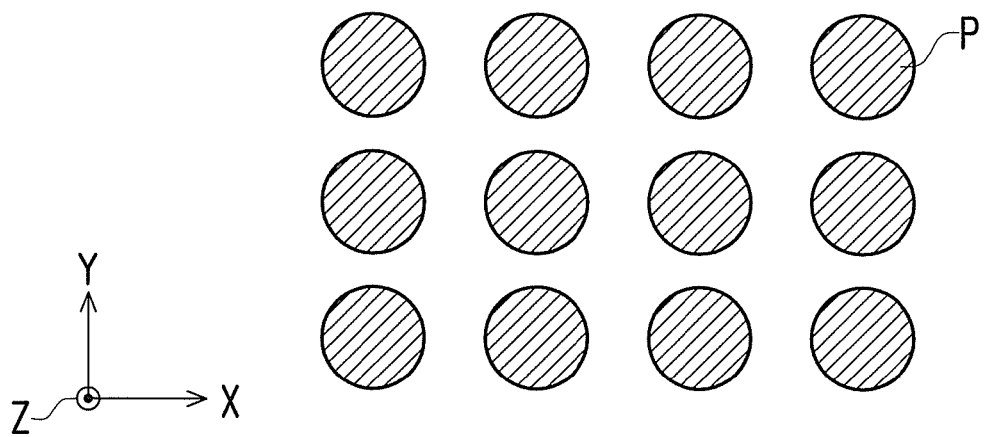
FIG. 5A to FIG. 5D are flow charts illustrating a process of forming a metal-oxide semiconductor channel through conducting a solution method according to an embodiment of the invention.
Figure 5B:
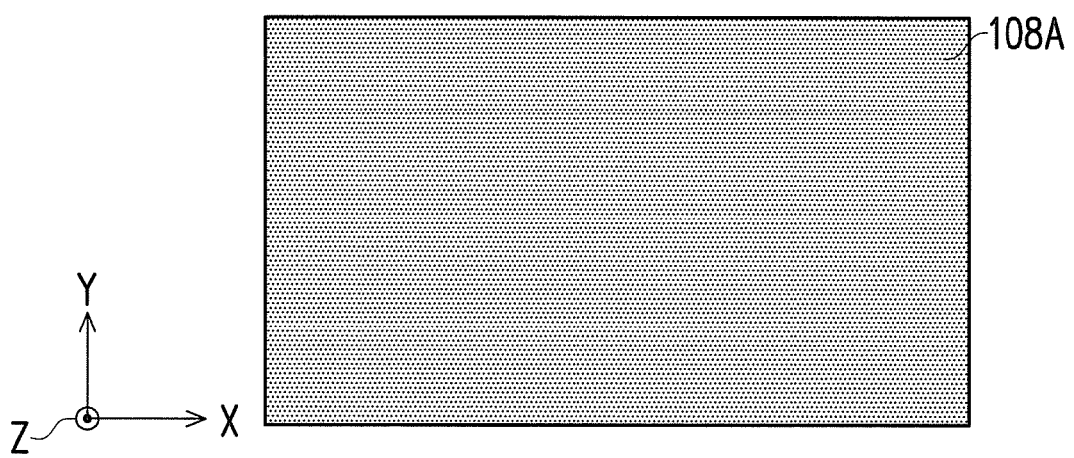
Figure 5C:
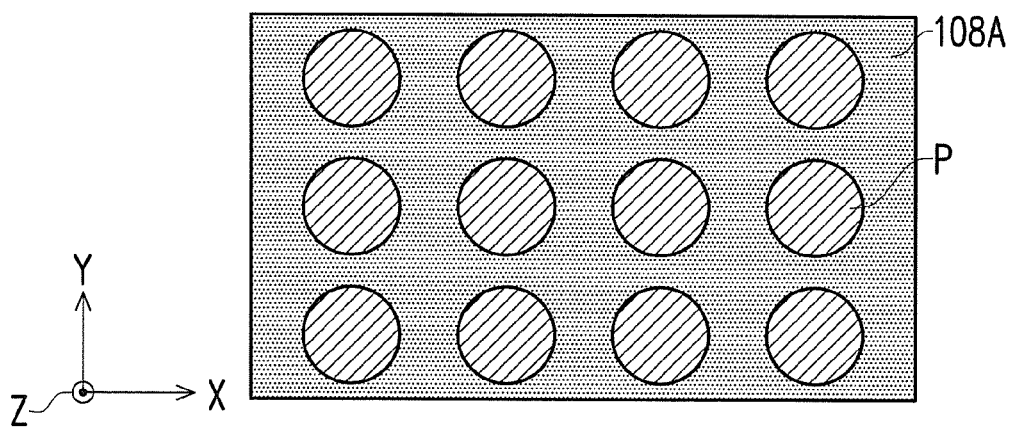
Figure 5D:
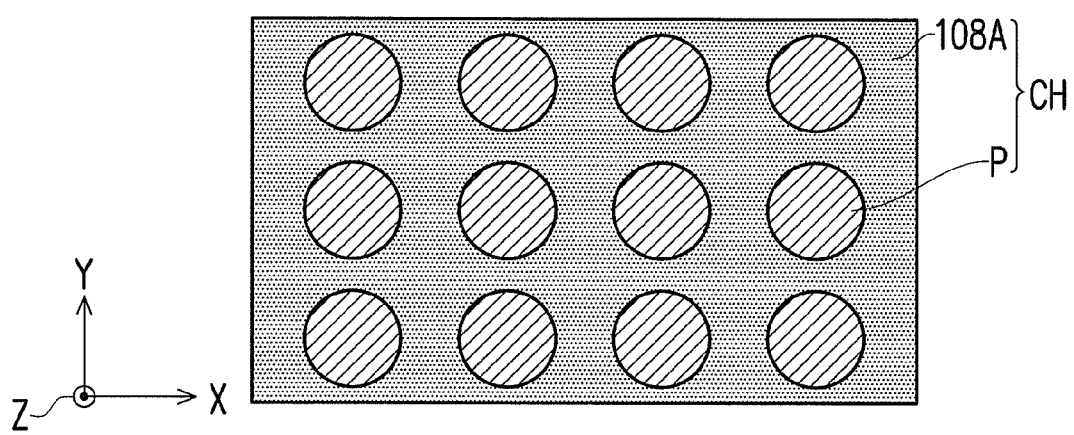

FIG. 5A to FIG. 5D are flow charts illustrating a process of forming a metal-oxide semiconductor channel through conducting a solution method according to an embodiment of the invention. As shown in FIG. 5A, a plurality of nano particles P are provided. In FIG. 5B, a metal-oxide semiconductor precursor 108A is provided. In FIG. 5C, the nano particles P and the metal-oxide semiconductor precursor 108A are mixed to form a mixed solution. In FIG. 5D, the mixed solution is solidified on the first base 102 (not shown in FIG. 5D) to form the metal-oxide semiconductor channel CH.

In the present embodiment, carrier concentration of the nano particles P may be greater than carrier concentration of the metal-oxide semiconductor layer 108. That is, conductivity of the nano particles P may be higher than that of the metal-oxide semiconductor layer 108. In the present embodiment, a material of the metal-oxide semiconductor layer 108 includes but should not be limited to aluminum zinc oxide (AZO), indium zinc oxide (IZO), indium zinc tin oxide (IZTO), indium-gallium-zinc oxide (IGZO), indium gallium oxide (IGO), zinc oxide (ZnO), cadmium oxide•germanium dioxide ($2CdO.GeO_2$), or nickel cobalt oxide ($NiCo_2O_4$); a material of the nano particles P includes but should not be limited to a conductor (e.g., ITO) or a semiconductor (e.g. IZO).

Figure 1D:
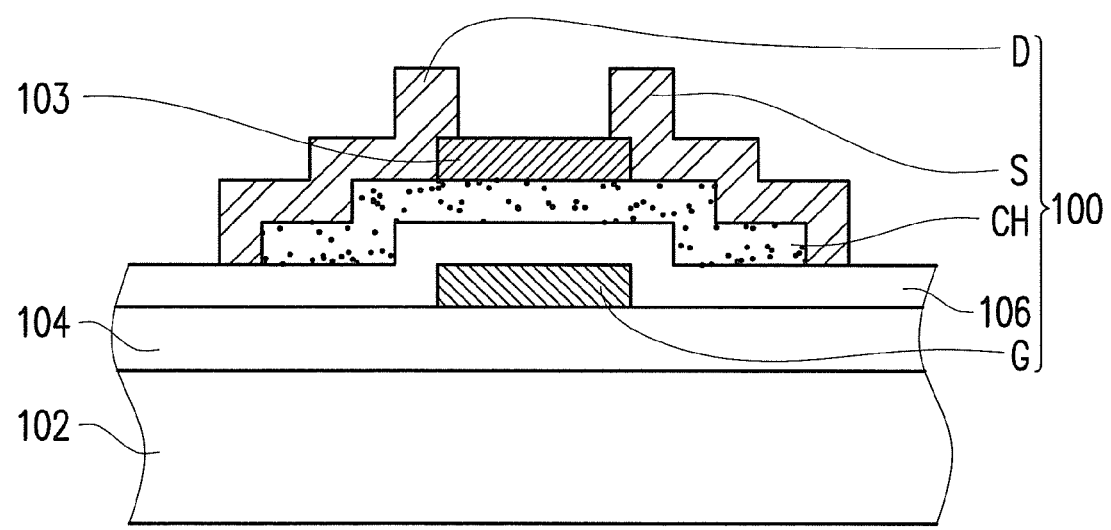

In FIG. 1D, after the metal-oxide semiconductor channel CH is formed in the present embodiment, a source S and a drain D may then be formed on the first base 102. The gate G, the source S, and the drain D are separated by the dielectric layer 106. Besides, the source S and the drain D are respectively located on two opposite sides of the metal-oxide semiconductor channel CH. So far, the TFT 100 is completely formed according to the present embodiment. Roughly speaking, the source S and the drain D are made of a metal material. However, the invention is not limited thereto, and the source S and the drain D may be made of other conductive materials in other embodiments, such as alloy, metal nitride, metal oxide, metal oxynitride, or a stacked layer containing metal and other conductive materials. Additionally, in the present embodiment, before the source S and the drain D are formed, a light-shielding layer 103 may be formed on the metal-oxide semiconductor channel CH, so as to lessen the influence of external light on the metal-oxide semiconductor channel CH and further ameliorate the performance of the TFT 100 described in the present embodiment.

Note that the TFT depicted in FIG. 1A to FIG. 1D and described above is exemplarily made by performing a method of fabricating a bottom-gate TFT. Nonetheless, the method of fabricating the TFT described herein is not merely applicable to the manufacture of the bottom-gate TFT. People having ordinary skill in the art may be able to make other types of TFTs in view of the present embodiment without departing from the scope or spirit of the invention.

Thin Film Transistor (TFT)

With reference to FIG. 1D, FIG. 2, and FIG. 3, the TFT 100 described in the present embodiment includes a gate G, a dielectric layer 106, a metal-oxide semiconductor channel CH, a source S, and a drain D. The gate G and the metal-oxide semiconductor channel CH are overlapped. The gate G, the source S, and the drain D are separated by the dielectric layer 106. Besides, the source S and the drain D are respectively located on two opposite sides of the metal-oxide semiconductor channel CH.

As shown in FIG. 2 and FIG. 3, the metal-oxide semiconductor channel CH includes a metal-oxide semiconductor layer 108 and a plurality of nano micro structures 109 disposed in the metal-oxide semiconductor layer 108 and separated from one another. The nano micro structures 109 in the present embodiment may be a plurality of nano particles P, and carrier concentration of the nano particles P may be greater than carrier concentration of the metal-oxide semiconductor layer 108. That is, conductivity of the nano particles P may be higher than that of the metal-oxide semiconductor layer 108. On account of the nano micro structures 109 located in the metal-oxide semiconductor layer 108, the metal-oxide semiconductor channel CH may be characterized by high field-effect mobility, and the TFT 100 including the metal-oxide semiconductor channel CH may have satisfactory electrical properties.

Note that the TFT depicted in FIG. 1D is a bottom-gate TFT, for instance. Nonetheless, the TFT described herein is not limited to the bottom-gate TFT. As long as the TFT includes the metal-oxide semiconductor channel CH that is constituted by the metal-oxide semiconductor layer 108 and the nano micro structures 109, the TFT falls within the scope of the invention.

Display Panel

Figure 6:
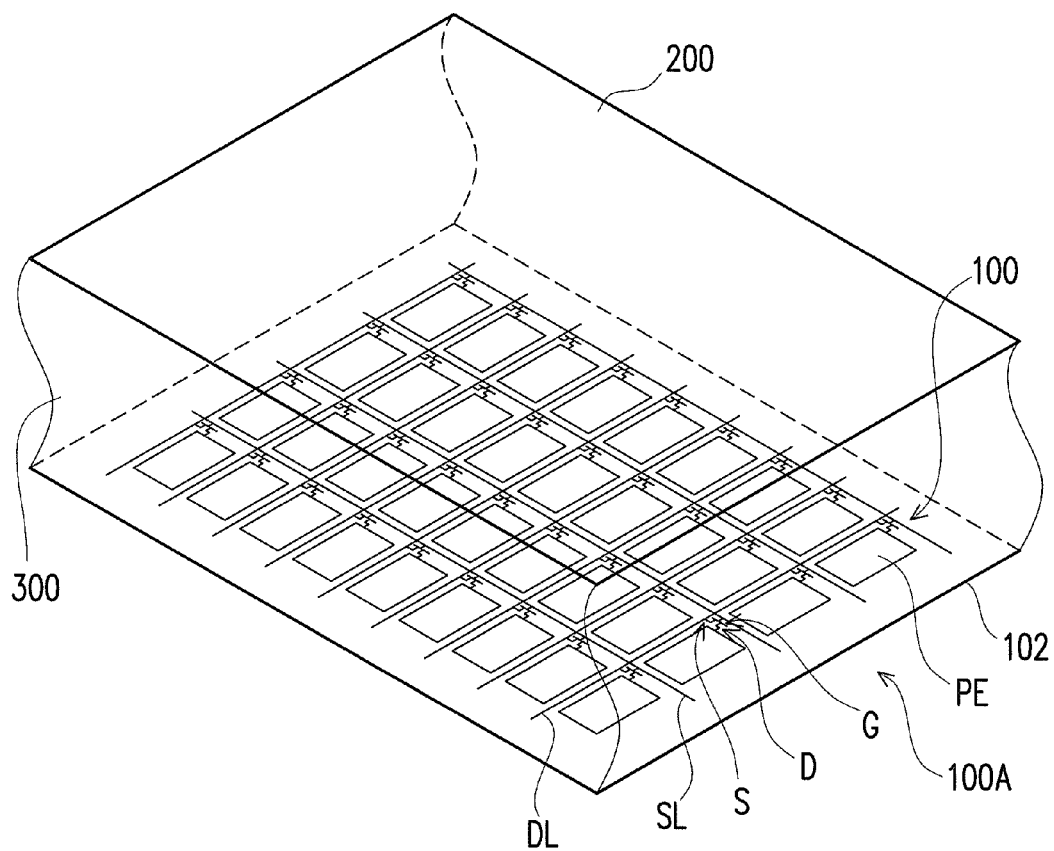
FIG. 6 is a schematic view illustrating a display panel according to an embodiment of the invention.

FIG. 6 is a schematic view illustrating a display panel according to an embodiment of the invention. With reference to FIG. 6, the display panel 1000 in the present embodiment includes a TFT array substrate 100A, an opposite substrate 200 disposed opposite to the TFT array substrate 100A, and a display medium 300 disposed between the TFT array substrate 100A and the opposite substrate 200. The opposite substrate 200 may be a color filter substrate. The display medium 300 includes a liquid crystal layer, an organic electroluminescent layer, or an electrophoretic particle layer, which should however not be construed as a limitation to the invention. According to the present embodiment, the TFT array substrate 100A includes a first base 102 and the aforesaid TFTs 100, and the TFTs 100 are arranged in arrays on the first base 102. The TFT array substrate 100A in the present embodiment may further include a plurality of pixel electrodes PE electrically connected to the TFTs 100. In the present embodiment, the TFT array substrate 100A further includes a plurality of scan lines SL and a plurality of data lines DL; the scan lines SL are electrically connected to the gates G of the TFTs 100, and the data lines DL are electrically connected to the sources S of the TFTs 100.

As described herein, the TFT 100 contains the metal-oxide semiconductor channel CH that has the nano micro structures, and said metal-oxide semiconductor channel CH with the nano micro structures is characterized by high field-effect mobility. Hence, the TFT 100 may have favorable electrical properties, and the display panel 1000 in which the TFTs 100 act as the active devices can also be characterized by the promising electrical properties.

Second Embodiment

Method of Fabricating a TFT

In the present embodiment, the method of fabricating a TFT is similar to that described in the first embodiment, whereas the step of forming the metal-oxide semiconductor channel CH in the present embodiment is different from the step provided in the first embodiment. Descriptions of the similarities of the two embodiments will be omitted, while the differences between the two embodiments will be explained hereinafter.

Figure 7A:
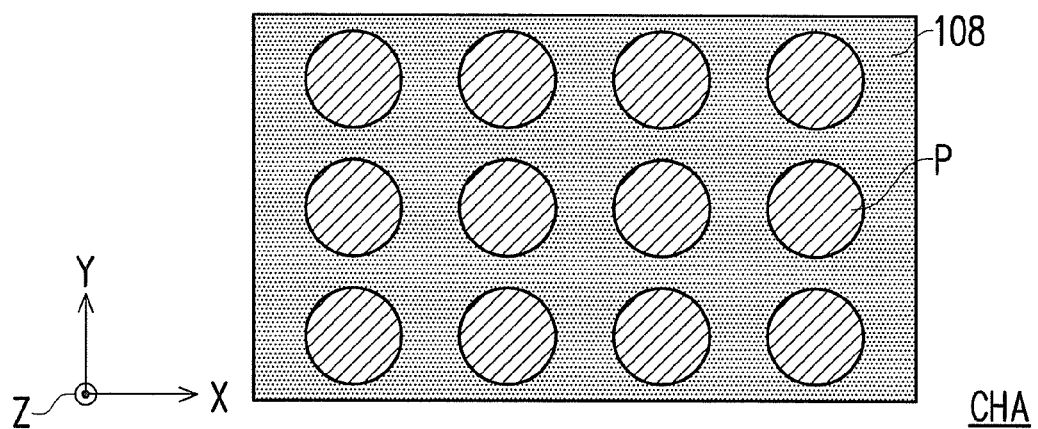
FIG. 7A to FIG. 7C are schematic cross-sectional flow charts illustrating a process of fabricating a metal-oxide semiconductor channel according to a second embodiment of the invention.
Figure 7B:
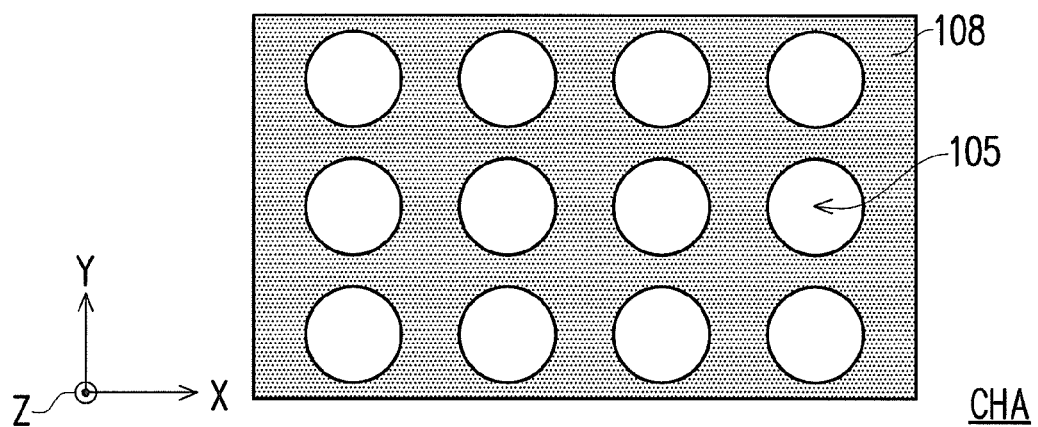
Figure 7C:
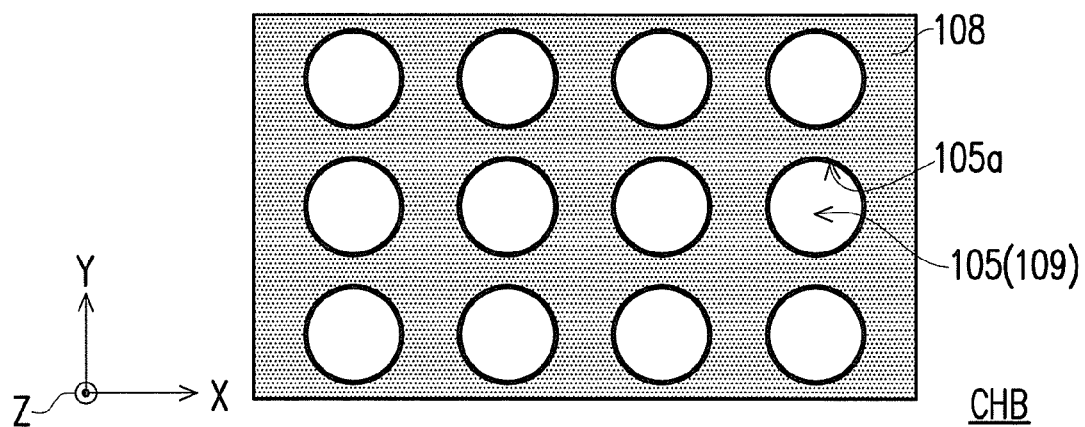

FIG. 7A to FIG. 7C are schematic cross-sectional flow charts illustrating a process of fabricating a metal-oxide semiconductor channel according to a second embodiment of the invention. With reference to FIG. 7A, a metal-oxide semiconductor pre-channel CHA is formed on the first base (not shown). The metal-oxide semiconductor pre-channel CHA includes a metal-oxide semiconductor layer 108 and a plurality of nano micro structures P disposed in the metal-oxide semiconductor layer 108 and separated from one another. In the present embodiment, the nano particles P may be made of organic substance, such as polystyrene (PS), poly lactide-co-glycolide (PLGA), and so on.

With reference to FIG. 7B, the nano particles P in the metal-oxide semiconductor layer 108 are removed to form nano pores 105. Particularly, in the present embodiment, the nano particles P in the metal oxide semiconductor layer 108 may be removed by means of an adhesive, a solvent, or plasma.

With reference to FIG. 7C, surface treatment is performed on inner walls 105a of the nano pores 105, such that the inner walls 105a of the nano pores 105 are conductive. According to the present embodiment, the surface treatment may be performed on the inner walls 105a of the nano pores 105 by means of plasma, a reactive gas, ultraviolet light, or a reactive liquid, so as to effect conductivity of the inner walls 105a of the nano pores 105. The plasma includes argon (Ar) and nitrogen ($N_2$). The reactive gas includes hydrogen and ozone. The liquid may be an acid or alkaline corrosive solution.

TFT and Display Panel

In the present embodiment, the TFT and the display panel are similar to those described in the first embodiment, whereas the structure of the metal-oxide semiconductor channel in the present embodiment is different from the structure of the metal-oxide semiconductor channel provided in the first embodiment. Descriptions of the similarities of the two embodiments will be omitted, while the differences between the two embodiments will be explained hereinafter.

With reference to FIG. 7C, the metal-oxide semiconductor channel CHB described in the present embodiment includes a metal-oxide semiconductor layer 108 and a plurality of nano micro structures 109 disposed in the metal-oxide semiconductor layer 108 and separated from one another. Different from the first embodiment, the present embodiment discloses the nano micro structures 109 that are nano pores 105, and inner walls 105a of the nano pores 105 are conductive.

Figure 8:
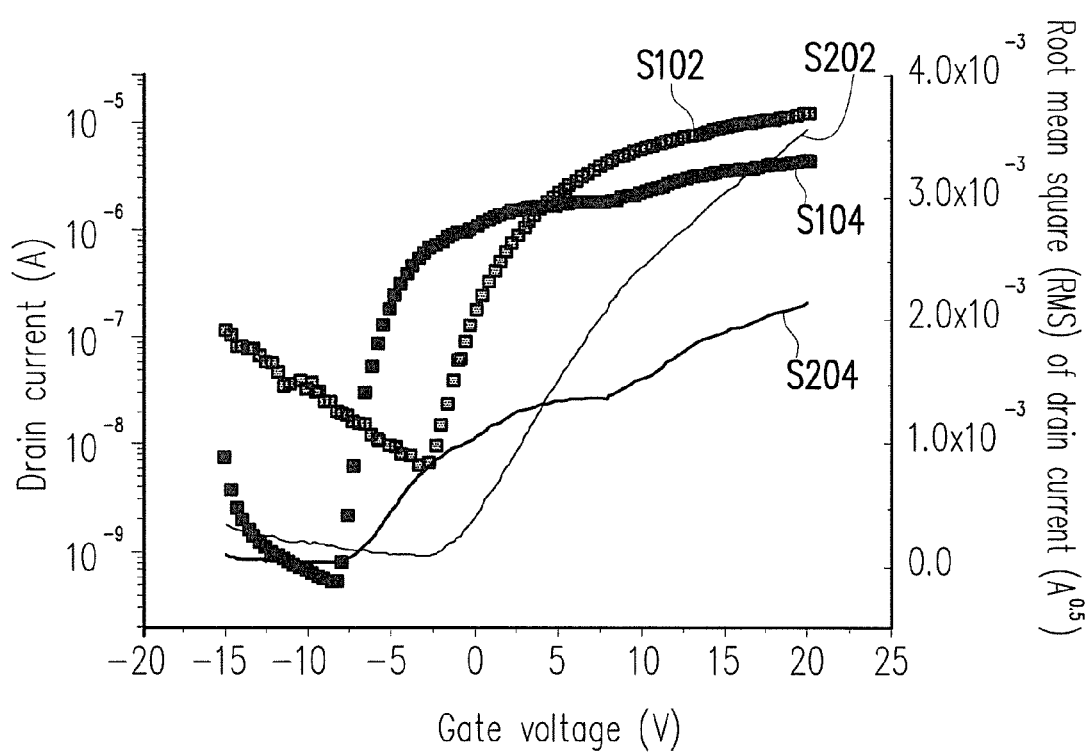
FIG. 8 shows the relation between a gate voltage and a drain current in the TFT described in the second embodiment and in the TFT described in a comparison example.

FIG. 8 shows the relation between a gate voltage and a drain current in the TFT described in the second embodiment and in the TFT described in a comparison example. The TFT provided in the comparison example is similar to the TFT disclosed in the present embodiment, while the inner walls of the nano pores do not undergo the surface treatment according to the comparison example and thus are not conductive. As shown in FIG. 8, the curve S102 illustrates the relation between the gate voltage and the drain current in the TFT described in the present embodiment; the curve S104 illustrates the relation between the gate voltage and the drain current in the TFT provided in the comparison example; the curve S202 illustrates the relation between the gate voltage and the square root of drain current in the TFT described in the present embodiment; the curve S204 illustrates the relation between the gate voltage and the square root of drain current in the TFT provided in the comparison example. According to the comparison result of the curves S102 and S104 and the comparison result of the curves S202 and S204, after the surface treatment is performed on the inner walls 105a of the nano pores 105 to effect the conductivity of the inner walls 105a, the field-effect mobility of the metal-oxide semiconductor channel CHB may be improved in the present embodiment, and thereby the TFT and the display panel described herein may have favorable electrical properties.

To sum up, in the TFT and the display panel described in an embodiment of the invention, the metal-oxide semiconductor channel includes a plurality of nano micro structures, and accordingly the field-effect mobility of the metal-oxide semiconductor channel may be improved. Moreover, the TFT and the display panel that include the metal-oxide semiconductor channel may have promising electrical properties.

It will be apparent to those skilled in the art that various modifications and variations can be made to the structure of the disclosed embodiments without departing from the scope or spirit of the invention. In view of the foregoing, it is intended that the invention covers modifications and variations of this invention provided they fall within the scope of the following claims and their equivalents.

What is claimed is:

1. A method of fabricating a thin film transistor, comprising:
    providing a first base;
    forming a gate on the first base;
    forming a dielectric layer on the first base;
    forming a metal-oxide semiconductor channel on the first base, the metal-oxide semiconductor channel comprising a metal-oxide semiconductor layer and a plurality of nano micro structures, the nano micro structures being distributed throughout an entire thickness of the metal-oxide semiconductor layer and separated from one another, wherein carrier concentration of the nano micro structures is greater than carrier concentration of the metal-oxide semiconductor layer, and the nano micro structures are a plurality of nano particles spread in the metal-oxide semiconductor layer; and
    forming a source and a drain on the first base, wherein the gate and the metal-oxide semiconductor channel are overlapped, the gate, the source, and the drain are separated by the dielectric layer, and the source and the drain are respectively located on two opposite sides of the metal-oxide semiconductor channel.

2. The method as recited in claim 1, wherein the step of forming the metal-oxide semiconductor channel on the first base comprises:
    placing the nano particles on the first base; and
    forming the metal-oxide semiconductor layer on the nano particles to cover the nano particles.

3. The method as recited in claim 1, wherein the step of forming the metal-oxide semiconductor channel on the first base comprises:
    providing the nano particles;
    providing a metal-oxide semiconductor precursor;
    mixing the nano particles and the metal-oxide semiconductor precursor to form a mixed solution; and
    solidifying the mixed solution on the first base to form the metal-oxide semiconductor channel.

4. The method as recited in claim 1, wherein each of the nano micro structures is a nano pore, and inner walls of the nano pores are conductive.

5. The method as recited in claim 4, wherein the step of forming the metal-oxide semiconductor channel on the first base comprises:

forming a metal-oxide semiconductor pre-channel on the first base, the metal-oxide semiconductor pre-channel comprising the metal-oxide semiconductor layer and the nano micro structures, the nano micro structures being located in the metal-oxide semiconductor layer and separated from one another;

removing the nano particles in the metal-oxide semiconductor layer to form the nano pores; and performing surface treatment on the inner walls of the nano pores to effect conductivity of the inner walls of the nano pores.

6. The method as recited in claim 5, wherein the step of removing the nano particles in the metal-oxide semiconductor layer comprises:

removing the nano particles in the metal-oxide semiconductor layer by means of an adhesive, a solvent, or plasma.

7. The method as recited in claim 5, wherein the step of performing the surface treatment on the inner walls of the nano pores to effect the conductivity of the inner walls of the nano pores comprises:

performing the surface treatment on the inner walls of the nano pores by means of plasma, a reactive gas, ultraviolet light, or a reactive liquid.

8. The method as recited in claim 5, wherein a material of the nano particles is organic.

9. A thin film transistor comprising:
a gate;
a dielectric layer;
a metal-oxide semiconductor channel comprising a metal-oxide semiconductor layer and a plurality of nano micro structures, the nano micro structures being distributed throughout an entire thickness of the metal-oxide semiconductor layer and separated from one another, wherein carrier concentration of the nano micro structures is greater than carrier concentration of the metal-oxide semiconductor layer, and the nano micro structures are a plurality of nano particles spread in the metal-oxide semiconductor layer, wherein a material of the metal-oxide semiconductor layer comprises aluminum zinc oxide (AZO), indium zinc oxide (IZO), indium zinc tin oxide (IZTO), indium-gallium-zinc oxide (IGZO), indium gallium oxide (IGO), zinc oxide (ZnO), cadmium oxide.germanium dioxide ($2CdO.GeO_2$), or nickel cobalt oxide ($NiCo_2O_4$), and a material of the nano micro structures comprises ITO or IZO, and the material of the nano micro structures is different from the material of the metal-oxide semiconductor layer; and a source and a drain, wherein the gate and the metal-oxide semiconductor channel are overlapped, the gate, the source, and the drain are separated by the dielectric layer, and the source and the drain are respectively located on two opposite sides of the metal-oxide semiconductor channel.

10. The thin film transistor as recited in claim 9, wherein each of the nano micro structures is a nano pore, and inner walls of the nano pores are conductive.

11. A display panel comprising:
a thin film transistor array substrate comprising:
a first base; and
a plurality of thin film transistors arranged in arrays on the first base, each of the thin film transistors comprising:
a gate;
a dielectric layer;
a metal-oxide semiconductor channel comprising a metal-oxide semiconductor layer and a plurality of nano micro structures, the nano micro structures being distributed throughout an entire thickness of the metal-oxide semiconductor layer and separated from one another, wherein carrier concentration of the nano micro structures is greater than carrier concentration of the metal-oxide semiconductor layer, and the nano micro structures are a plurality of nano particles spread in the metal-oxide semiconductor layer, wherein a material of the metal-oxide semiconductor layer comprises aluminum zinc oxide (AZO), indium zinc oxide (IZO), indium zinc tin oxide (IZTO), indium-gallium-zinc oxide (IGZO), indium gallium oxide (IGO), zinc oxide (ZnO), cadmium oxide.germanium dioxide ($2CdO.GeO_2$), or nickel cobalt oxide ($NiCo_2O_4$), and a material of the nano micro structures comprises ITO or IZO, and the material of the nano micro structures is different from the material of the metal-oxide semiconductor layer; and
a source and a drain, wherein the gate and the metal-oxide semiconductor channel are overlapped, the gate, the source, and the drain are separated by the dielectric layer, and the source and the drain are respectively located on two opposite sides of the metal-oxide semiconductor channel;
an opposite substrate disposed opposite to the thin film transistor array substrate; and
a display medium disposed between the thin film transistor array substrate and the opposite substrate.

12. The display panel as recited in claim 11, wherein each of the nano micro structures is a nano pore, and inner walls of the nano pores are conductive.

* * * * *